United States Patent [19]

Bickel

[11] 4,097,708

[45] * Jun. 27, 1978

[54] SOLID STATE MICROWAVE OVEN POWER SOURCE

[75] Inventor: Samuel H. Bickel, Garland, Tex.

[73] Assignee: Texas Instruments Incorporated, Dallas, Tex.

[*] Notice: The portion of the term of this patent subsequent to Apr. 27, 1993, has been disclaimed.

[21] Appl. No.: 673,024

[22] Filed: Apr. 2, 1976

Related U.S. Application Data

[63] Continuation-in-part of Ser. No. 497,152, Aug. 13, 1974, Pat. No. 3,953,702.

[51] Int. Cl.² .............................................. H05B 9/06
[52] U.S. Cl. ..................... 219/10.55 R; 219/10.55 B; 219/10.55 F; 333/1.1; 343/792.5
[58] Field of Search .................. 219/10.55 R, 10.55 B, 219/10.55 F; 333/1.1, 84 R, 84 M, 95 A; 343/792.5, 799, 801

[56] References Cited

U.S. PATENT DOCUMENTS

| | | | |
|---|---|---|---|
| 3,456,213 | 7/1969 | Hershenor | 333/84 X |
| 3,509,465 | 4/1970 | Andre et al. | 343/792.5 |
| 3,549,852 | 12/1970 | Scott | 219/10.55 R |
| 3,557,333 | 1/1971 | McAvoy | 219/10.55 R |
| 3,691,338 | 9/1972 | Chang | 219/10.55 R |

*Primary Examiner*—Arthur T. Grimley
*Attorney, Agent, or Firm*—Rene' E. Grossman; Alva H. Bandy

[57] ABSTRACT

Disclosed is a solid state power source which combines the power of a plurality of negative resistance transistor packages in a circular cavity to form an oscillator producing a resonant source of microwave energy for radar or microwave energy oven applications. The power of the plurality of negative resistance transistor packages is fed to the cavity through a plurality of gapped coaxial cable antennae selectively positioned adjacent the circular cavity wall. The antennae terminate in an microwave energy termination and dc base biasing circuitry.

10 Claims, 8 Drawing Figures

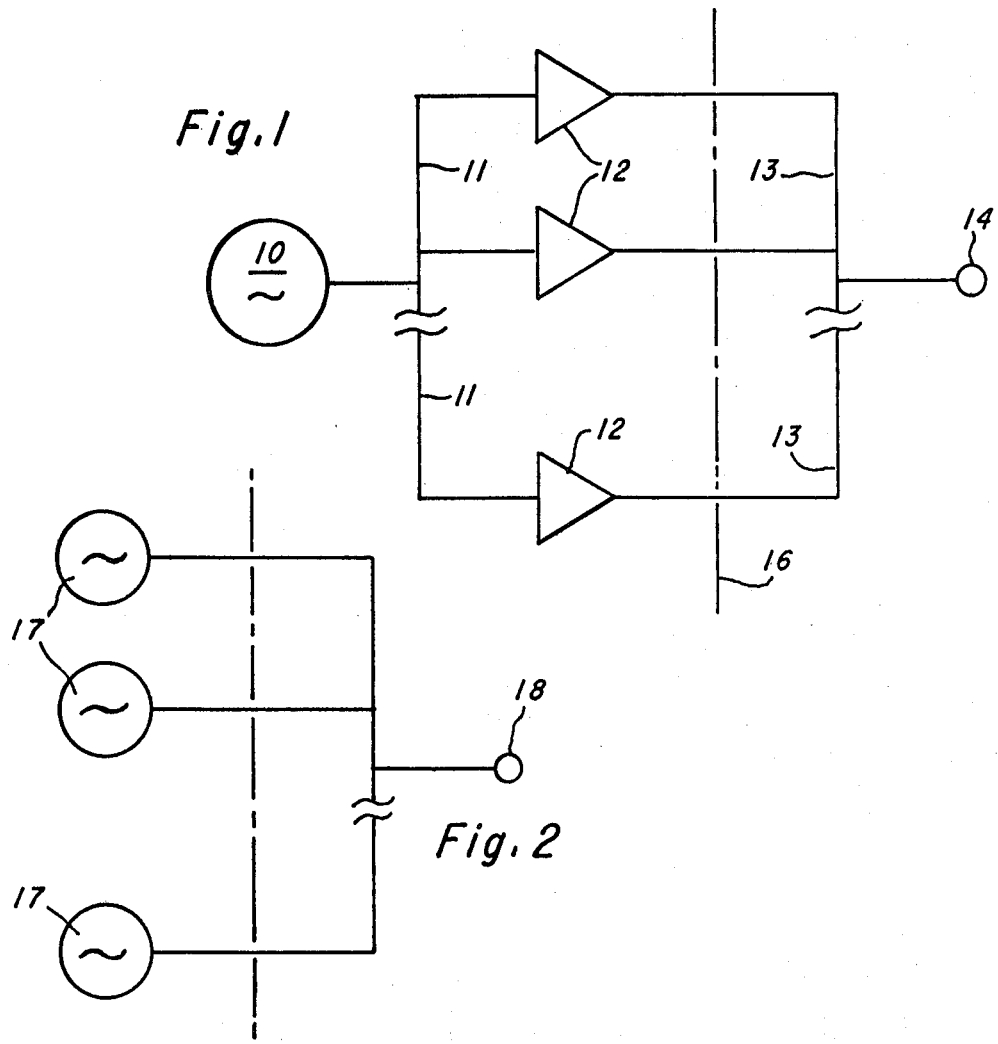
Fig.1
Fig.2
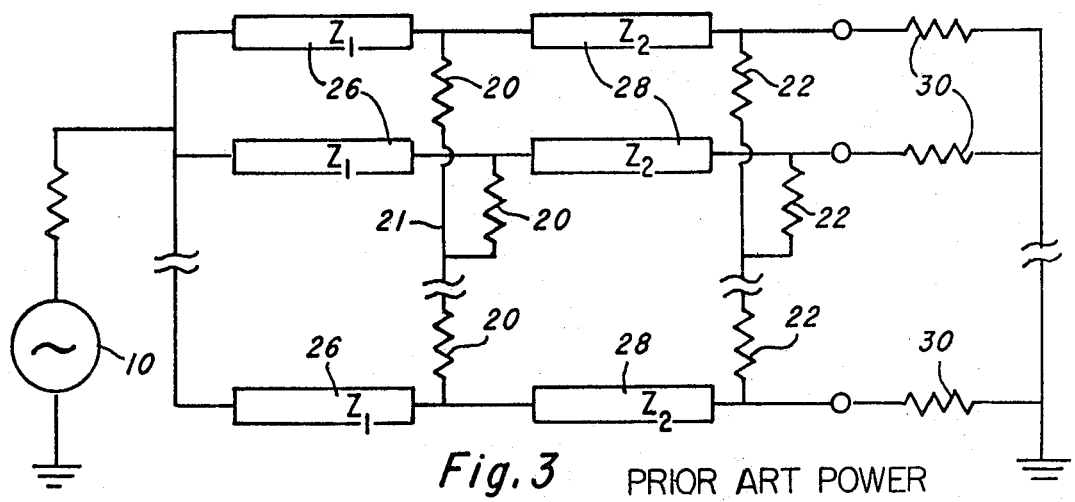
Fig.3 PRIOR ART POWER DIVIDER

SOLID STATE MICROWAVE OVEN POWER SOURCE

This application is a continuation-in-part of copending application Ser. No. 497,152, filed Aug. 13, 1974, now Pat. No. 3,953,702, entitled "Solid State Microwave Oven Power Source".

This invention relates to microwave heating devices, and more particularly, to apparatus for combining the power from a plurality of solid state microwave generating devices into a common port to form a microwave energy power source oscillator.

The usefulness of microwave energy in thawing, heating and cooking foods and in heating other materials is widely recognized. Microwave ovens which are powered by means of a magnetron are in common use. Some of the problems encountered in magnetron powered microwave ovens are discussed in U.S. Pat. No. 3,691,338 issued to Chang on Sept. 12, 1972. Owing to the short lifetime of magnetrons and the non-uniform heating caused by the use of a single microwave power source the desirability of use of solid state microwave power sources has been recognized. The Chang patent and the McAvoy patent cited therein both represent attempts to solve these prior art problems by use of multiple solid state microwave sources.

A new problem is presented by use of multiple microwave power sources. The multiple sources must be coupled to the heating cavity by means of some type of antenna, which will also couple energy from the cavity back to the power source. If the power sources are not phase locked they will tend to absorb each other's generated power thereby reducing the amount of energy reaching the material in the oven and possibly destroying the individual sources. The loss of power is particularly undersirable when solid state power sources are used due to their low efficiency and low power output. The possible destruction of the solid state sources was recognized in the Chang patent with the use of a microstrip circulator stated as a solution. A circulator will protect the power sources from reflected energy damage but also will cause all reflected energy to be absorbed in a resistive load instead of the material in the cavity or oven and thus does not solve the loss of power problem. Circulators are also relatively expensive and difficult to produce.

Accordingly, it is an object of the present invention to provide an apparatus for maintaining a plurality of solid state microwave power sources in a phase locked condition and combining the power into a single load.

Another object is to provide a solid state microwave oven which is economical in construction and which lends itself to mass production techniques.

In accordance with this invention, a plurality of microwave amplifiers are driven in phase by a single oscillator and an impedance matching equal phase power divider. A similar power divider network is used in reverse to combine the multiple amplifier outputs in phase into a single port for driving a conventional antenna. Alternatively the outputs of multiple solid state oscillators may be combined in an equal phase power combiner which causes the oscillators to phase lock. Another embodiment of the invention uses multiple solid state oscillators coupled to a cylindrical resonant cavity so that each oscillator is phase locked to the resonant frequency thereby avoiding any absorption of power from the cavity by the oscillators. A microwave power source oscillator is provided by coupling the outputs of a plurality of negative resistance transistor packages to a circular cavity by means of gapped coaxial cable antennae selectively spaced about the circular walls of the cavity.

Other objects, features, and advantages of this invention will become better understood by reference to the following detailed description when read in conjunction with the accompanying drawings wherein:

FIG. 1 is a block diagram of a set of microwave amplifiers being driven in phase by a single oscillator.

FIG. 2 is a block diagram of phase locked oscillators with coupled outputs.

FIG. 3 is a schematic diagram of an equal phase power divider.

Figure 4:
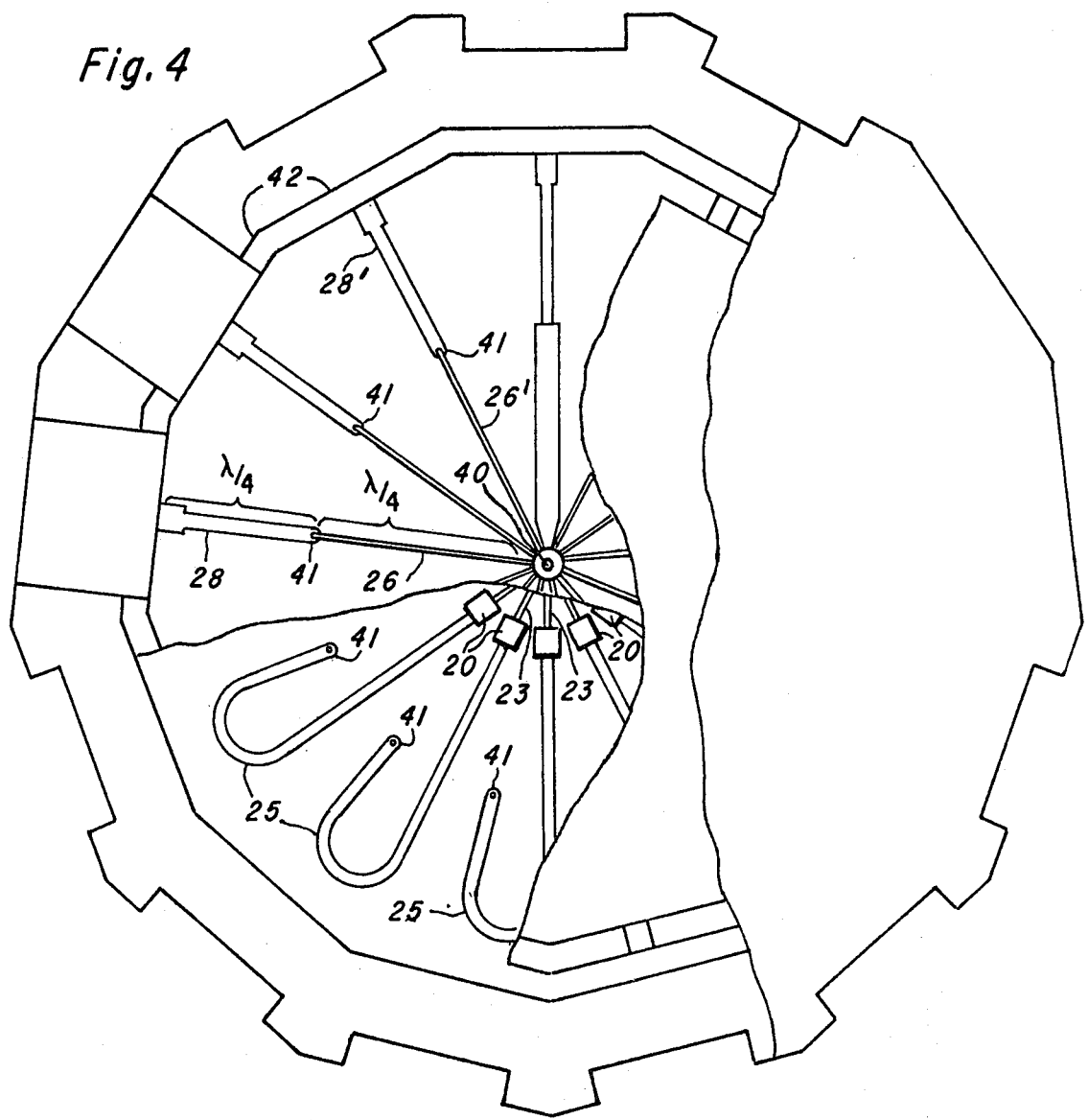
FIG. 4 illustrates a microstrip line embodiment of the power divider network of FIG. 3.

The operation and construction of a solid state amplifiers and oscillators which may be used as power sources in the present invention is shown and discussed in an article entitled "Recent Advances in Solid State Microwave Generators", pp. 44–86 of *Advances in Microwaves*, Vol. 2, 1967, Academic Press, Inc., New York, to which reference may be had for a more detailed description.

FIG. 1 illustrates one embodiment for combining power from multiple microwave power sources into a single port. Power from a single oscillator 10 is divided by transmission lines 11 and fed to multiple amplifiers 12. The amplified signal is recombined by transmission lines 13 into a single output 14. To obtain maximum power output it is necessary to maintain the outputs of all amplifiers 12 in phase as indicated by line 16 which represents an equal phase surface. For any condition other than perfect phase matching the total power output is less than the theoretical maximum which is the power out of a single amplifier times the number of amplifiers.

As illustrated in FIG. 2, multiple oscillators 17 may be used as power sources with their power combined into a single output port 18. As with the amplifiers of FIG. 1, it is necessary that all the oscillators remain phase locked to achieve maximum power out.

To maintain the amplifiers 12 of FIG. 1 in phase locked condition, it is necessary to drive each amplifier with an equal phase signal. As in any high frequency system it is also necessary to impedance match the oscillator 10 output to the multiple amplifier 12 inputs. The equal phase power divider shown schematically in FIG. 3 both divides the oscillator power and matches the impedances. Such a power divider is discussed in Hung Yuet Yee, et al, "N-way TEM-Mode Broad-Band Power Dividers," *IEEE Transactions on Mircowave Theory and Techniques*, MTT-18, No. 10, October 1970 to which reference may be had for a more detailed description. The transmission line segments 26 and 28 have impedances and lengths chosen to operate as impedance transformers to match the impedances of the amplifier inputs 30 to that of the oscillator output. This network forms the divider network shown as lines 11 in FIG. 1. If all the amplifier input impedances 30 are equal, the wave patterns on transmission line segments 26, 28 will be identical, that is, all signals on the lines will be even mode. Resistor networks 20, 22 are connected to the transmission lines at points equally spaced from the amplifier inputs. Since the even mode signal is equal at the resistor connections of each network there is no absorption of the signal. But if one of the amplifier inputs 30 becomes mismatched, it will cause reflections to occur on the respective transmission line, but not on the others. This odd mode signal will appear across the resistors and will be absorbed by them. Thus, it is seen that the resistor networks 20, 22 isolate the oscillator 10 and the other amplifier inputs 30 from any mismatch occurring at one of the amplifier inputs, which could occur, for example, when an amplifier becomes inoperative.

Just as the network of FIG. 3 is used to divide power from the oscillator to the amplifiers, it also may be operated in reverse to combine power from the amplifier outputs into a single port while maintaining constant phase conditions. It is used in reverse to form the power combiner network shown as lines 13 in FIG. 1.

FIG. 4 illustrates a stripline embodiment of the power divider network of FIG. 3 formed on double sides metal clad 1/32 inch thick polytetradluoroethylene resin coated fiberglass boards. Like numbers will be used to designate like parts shown schematically in FIG. 3. A suitable resin is that sold under the trademark "Teflon" by E. I. DuPont de Nemours and Company. Each board has a diameter of one wavelength at a preselected resonant energy frequency. FIG. 4 shows the two quarter wavelength transmission line segments 26, 28 having preselected widths coupled in series on one side of the board and a conductive layer (ground plane) on the opposite side which coacts to form a microwave impedance transformer. Twelve of these transmission line segments are formed in a radial pattern as shown to divide power from the center 40 to the perimeter 42 of the circular pattern. A second identical transformer pattern is likewise used in reverse to combine power from twelve outputs feeding into ports on the perimeter into the single center port 40.

The isolation resistors 20 shown in FIG. 3 are formed on the reverse side of the microstrip circuit of FIG. 4. The resistors 20 are placed on a circular microstrip board like that on which the impedance transformers are formed. The two boards are placed back to back, that is with ground planes in contact. Feedthroughs are provided at the junctions 41 of the two quarter wave sections of the impedance transformers to allow the connections to the isolation resistor network.

The resistors 20 (FIGS. 3 and 4) should be physically close to the common junction 21 and also close to the impedance transformer feedthrough 41. The resistors may be placed in the center of the board in a circle as shown in FIG. 4. The connection to the impedance transformer is then made through half wavelength sections of stripline 25, which place the resistors electrically close to the center 41 of the impedance transformers. The common resistor junction is made through lines 23. As the number of resistors 20 increases, the distance from the common junction increases due to the finite size of chip resistors 20. The lines 23 add capacitance to the common junction 21 and cause dissipation of even mode energy.

The resistors 20 may be placed near the feedthroughs 41 shown in FIG. 4. The half wavelength line 25 is then used to connect the resistors to the common junction 21. By thus transposing the positions of the resistors and the half wavelength lines the connecting lines 23 are eliminated and the resistors are positioned in a larger circle where more area is available.

Figure 5:
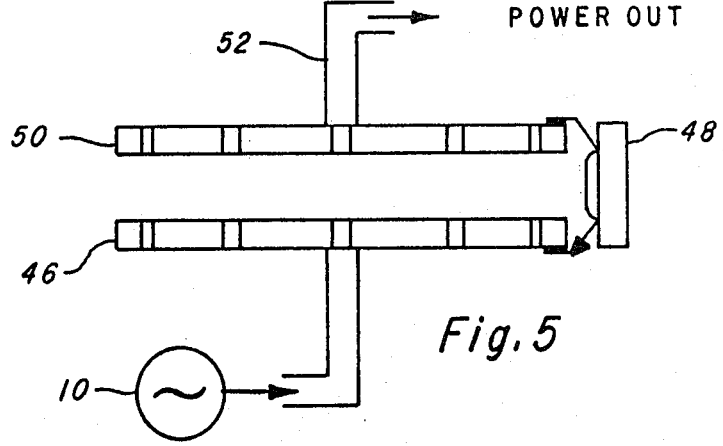
FIG. 5 is a pictorial view of a completed microwave power source in accordance with a preferred embodiment.

FIG. 5 shows a complete microwave power source comprising two of the power divider boards of FIG. 4. The oscillator 10 feeds power to the center of power divider 46 which drives multiple amplifiers 48, of which only one is shown. Each amplifier 48 is a solid state amplifier having its emitter coupled to the power divider 46 output port and its collector coupled to the power combiner 50 input port. The amplifer outputs are fed into the power combiner 50 and combined into the single port 52.

Figure 6:
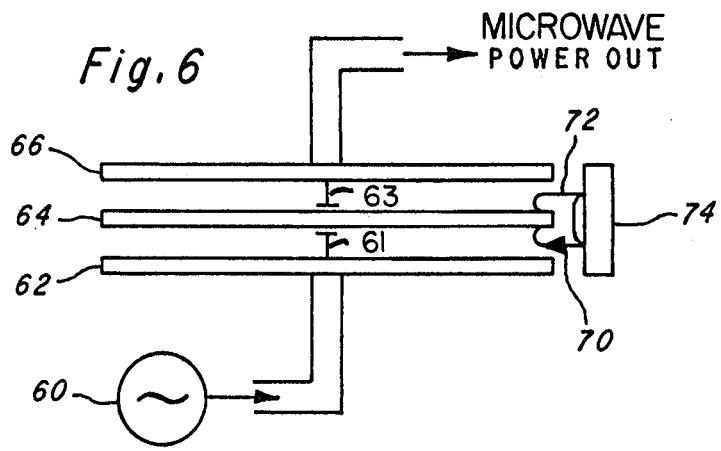
FIG. 6 is a pictorial view of an embodiment of the present invention employing a radial power divider.

FIG. 6 illustrates another microwave power source similar to that of FIG. 5 in operation but utilizing a different form of power divider/combiner. In this case the power from oscillator 60 feeds power through probe 61 into the center of a disc shaped waveguide formed of circular conductive plates 62 and 64 which may be, for example, metal plates. Due to symmetry the energy travels radially toward the circumference of the disc and arrives with equal phase at all points on the circumference, a plurality of antennas 70 receive the microwave energy. The antennas are coupled to a corresponding plurality of amplifiers, i.e., for example, they are coupled to the emitters of solid state microwave amplifiers 74. The collectors of amplifiers 74 are coupled to drive similar loops 72 along the circumference of a second disc shaped waveguide formed of plates 64 and 66. The antennas 70 and 72 are H field coupling for coupling electromagnetic energy in and out of the amplifier. Being in phase, the outputs form a constant phase surface which travels to probe 63 of the output port located at the center of this second waveguide.

Electrically symmetric power combiners such as the stripline or radial waveguide combiners described above provide a coherent phase front of signal traveling from input to output. If the outputs of multiple oscillators are coupled to the inputs of a combiner of this type an injection locking mechanism phase locks the oscillators at a single frequency. Being phase locked the oscillators will not absorb the power generated by each other and the power coupled to the combiner output will be the sum of the outputs of all the oscillators. This phase locking mechanism attends a free running oscillator having a high power output coupled to a stable low power signal; by the injection of the low power signal into the high power signal, the high power frequency locks onto the low power frequency. This phase locking mechanism is analyzed by Kaneyuki Kurokawa in "The Single-Cavity Multiple-Device Oscillator" published in the IEEE Transactions on Microwave Theory and Techniques, MTT-19, No. 10, October 1971, to which reference may be had for a more detailed description. When the above described stripline combiner is used the isolation resistor networks 20, 22, and 30 (FIG. 1) are removed to prevent multiple oscillation modes. One skilled in the art will recognize that the waveguide formed by metal plates 64 and 66 conveys the microwave power or energy in the same manner as an oven cavity. Thus, the waveguide formed by plates 64 and 66 can form an oven cavity.

Figure 7:
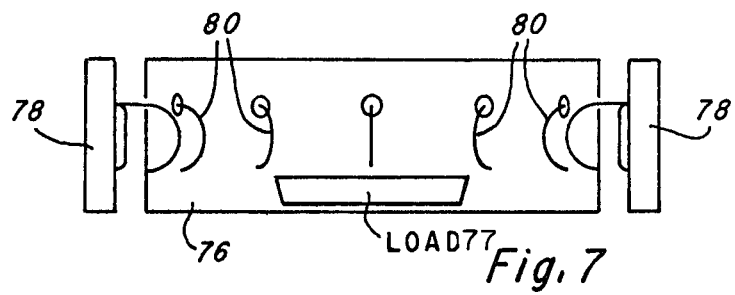
FIG. 7 is a pictorial view of an embodiment of the present invention employing a resonant cylindrical cavity.

FIG. 7 shows as another embodiment of the present invention the feature that the waveguide forming plates 64 and 66 of FIG. 6 form a resonant cavity 76. A cylindrical resonator as illustrated (FIG. 7) has a maximum electrical field at the center decaying to zero at the conducting side walls. For a cylindrical cavity to resonate the radius according to the teachings of Ramo and Whinnery, *FIELDS AND WAVES IN MODERN RADIO*, Section 10–08, p. 429, must be equal to the wavelength at the desired frequency divided by 2.61. The oscillators 78 are solid state microwave oscillators positioned on the cylindrical surface where the magnetic field is maximum and coupled to the resonant field by magnetic coupling loops or antennas 80. Under these conditions the cavity 76 forms the cooking compartment which acts like the symmetrical power combiners described above and the oscillators all phase lock to the resonant mode of cavity oscillations. The oscillators 78 each couple power into the cavity 76 with substantially no absorption of power from the cavity. The load 77 to be heated is placed directly in the cavity 76. To maintain optimum phase locked conditions, the load is centered in the cavity to load each oscillator equally. The advantage of this embodiment is the elimination of a power combiner and its cost.

Figure 8:
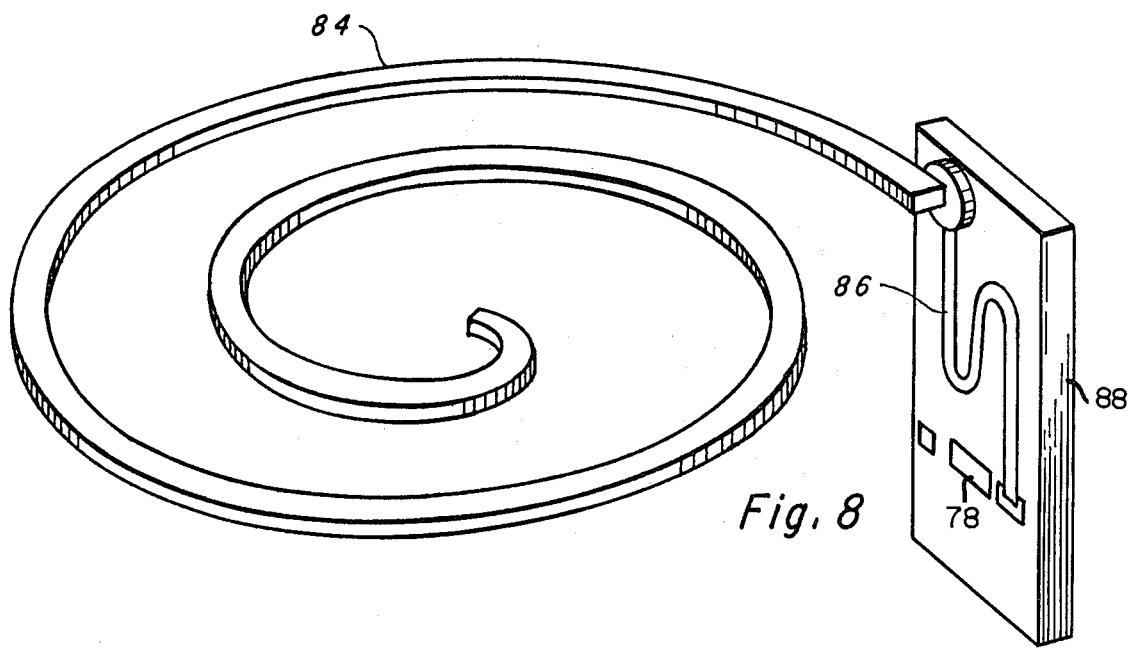
FIG. 8 is a pictorial view of a multiple arm spiral antenna for use in the embodiment of FIG. 7.

FIG. 8 illustrates one element of a multiple arm spiral antenna which in another embodiment of FIG. 7 is used in place of the magnetic coupling loops or antennas 80 of FIG. 7 to insure even loading of the individual power sources regardless of load placement. Each antenna has one arm 84 per source and distributes the coupling over the entire cavity. Thus a load may be placed at any point in the cavity and will draw essentially the same power from each source, avoiding possible loss of phase locked condition.

When solid state amplifiers 78 are used as power sources for the cavity of FIG. 7, an equal phase power divider as described above (FIG. 3) is used to divide power from a single oscillator and provide an equal phase signal to each amplifier input. But if the spiral antenna (FIG. 8) is used to radiate energy into the cavity, its inputs have a specific phase relationship in order to excite a particular field mode on the antenna. A first mode of radiation from a spiral antenna is achieved by having the input signals phase shifted electrically according to the angular position of the input on the circumference of the antenna. Thus, if the antenna has 16 elements, each element will be spaced 22.5° apart on the circumference and each input signal must lag 22.5° behind the previous input if measured sequentially around the antenna in one direction. The phase shifting can be accomplished by building the proper length section of stripline 86 into each amplifier module 88 (FIG. 8).

If solid state oscillators are used to supply power to the resonant cavity (FIG. 7) through a spiral antenna (FIG. 8), each will phase lock to the cavity at its proper phase angle. Thus, it can be seen that the oscillators phase lock to the resonant cavity oscillations and not actually to a common phase. This is required by the fact that the spiral antenna would not radiate and thus could not couple energy to the cavity if all inputs were in phase. It is the coupling of each oscillator to the standing wave pattern of the cavity which causes the injection locking mechanism and keeps the oscillator in phase.

FIG. 9 shows, as still another embodiment of the invention an improved solid state negative resistance transistor microwave power source apparatus 100 having a plurality of negative resistance microwave transistor, packages 102, a heat sink 104, a cavity 106, and a plurality of RF termination and transistor package biasing networks 108. The plurality of negative resistance transistor packages 102 are mounted upon the heat sink 104 and the heat sink 104 is mounted on a major surface 110 of the cavity 106. A plurality of coaxial antennas 112 connect the plurality of negative resistance transistor packages 102 to the cavity 106; the antennas 112 terminate in the plurality of RF termination and transistor package biasing networks 108. The microwave termination and transistor package biasing networks 108 are mounted on a major surface 114 of the cavity 106 opposite the heat sink bearing surface 110. An output probe 116 is centrally mounted in the cavity 106 and is coupled to an output coaxial cable 118 for removing the combined power from the oscillator or cavity 106 for use a magnetron in radar applications or microwave energy ovens.

The heat sink 104, upon which the plurality of negative resistance microwave transistor packages 102 are mounted, includes a plurality of fins 120 supporting a cover plate 122. The fins 120 extend radially from a centrally disposed fan 124. The fan 124 is connected to the drive shaft of a fan drive motor 126. The fan drive motor is attached to the plate 122 for support. The transistor packages 102 are cooled by blowing air through the finned heat sink structure. It will be understood by those skilled in the art that many other heat sink arrangements are possible.

Referring now to FIG. 10, each negative resistance microwave transistor package 102 includes a transistor 128 which may be, for example, an N-P-N microwave transistor. The transistor includes a collector 130 coupled to ground, an emitter 132 coupled to one terminal of an RF choke 134 and a base 136 coupled to the coaxial antenna 112 more specifically described hereinafter. A capacitor 138 is connected between the emitter 132 and base 136 of the transistor 128. The other end of RF choke 134 is coupled to the junction of a dc input terminal 140 and a bypass capacitor 142 coupled to ground.

In this arrangement the collector 130 of transistor 128 is attached directly to the transistor heat sink (not shown), for example, by soldering. Thus, the BeO of the common base microwave transistor is not required. This technique decreases the thermal resistance of the transistor and thereby increases the dissipation of heat. The emitter-base capacitor 138 is bonded into the transistor package 102 (FIG. 9), and its value selected to form a series resonant circuit with inductances of the emitter and base to increase substantially the negative resistance at the collector-base output. Whilst the RF choke 134 presents a high impedance to radio frequencies and the bypass capacitor provides a low-impedance path to ground ratio frequencies. Thus, the transistor 128 operates at high power levels without the addition of a collector-emitter feedback capacitor and the two port transistor 128 has been converted into a one port negative resistance device by a proper choice of feedback reactances in the package.

An equivalent circuit for the negative resistance microwave transistor package is shown in FIG. 11. The common base microwave transistor 128 is represented by the active network enclosed by the dashed line in which b, c, and e represent, respectively, the base 136, collector 130, and emitter 132. The package lead inductances are represented by $L_e$, $L_b$, and $L_c$. Capacitor 138 forms a resonant circuit with $L_e$ and $L_b$ to form a near maximum negative resistance at the collector base output. This negative resistance results from feedback through $C_o$ and the base lead. With this negative resistance maximized by an appropriate choice of base lead inductance most of the power is fed back into the transistor which results in high current in the emitter loop.

Returning now to FIG. 9, the coaxial antennas 112 are formed of coaxial lines 144 with the center conductor soldered to bases 136 of the plurality of transistors 128. The physical dimensions of the coaxial lines limits the number of lines; the lines must be far enough apart to prevent coupling outside the cavity 106. The antennas are formed by gapping the outside conductor of the coaxial lines one quarter wavelength ($\lambda/4$) from the transistor connectors. The gaps are about ⅛ inch long. The coaxial lines 144 pass through the cavity 106 with the gaps positioned therein.

The cavity 106 (FIG. 9) is a circular symmetric cavity. The radius is chosen to excite the $TM_{010}$ mode of oscillation at the frequency of interest, i.e. the cavity radius is equal to $0.3828 \lambda$ where $\lambda$ is the fill space wavelength. The major surfaces 110 and 114 of the cavity 106 have corresponding apertures about $\lambda/10$ or less distance from the cavity sidewalls. The coaxial lines 144 pass through the corresponding apertures with their antenna forming gaps 146 centered between the cavity surfaces 110 and 114. The probe 116 is centrally mounted in the cavity 106 on the major surface 114 supporting the RF termination and dc bias circuits. The probe 116 is coupled to the 50 ohm coaxial output line 118. By adjusting the length of the probe 116, the effective impedance of the load can be adjusted to match that of the transistors 128. When the matched condition exists, the cavity together with the transistors forms an oscillator. The more transistors used, the more the resistance is lowered by the parallel combination. This action requires the length of the output probe 134 in the cavity to be increased.

Referring to FIG. 12, the microwave termination and d.c. bias circuit 108 includes a layer of high loss dielectric material 148 which may be, for example, a ⅛ inch layer of a carbon impregnated body of expanded synthetic resinous material, such as that sold under the trademark STYROFOAM. The layer of dielectric material is attached to the outer surface of the major surface 114 of cavity 106. Conducting lines 150, formed on the bottom surface of the high loss dielectric 148, interconnect the coaxial lines 144 of the antennas 112 to a centrally disposed conductor hub 152. The cavity coaxial output line 118 passes through the hub 152. Hub 152 is coupled to a grounded capacitor 154 and to junction of a d.c. voltage source 156 and grounded bypass capacitor 158. The widths of conductor lines 150 are chosen to match the microwave impedance of the coaxial cables 144 of antennas 112. By this means a microstrip circuit is constructed where the major portion of the microwave field is contained between these conducting lines 150 and the cavity sidewalls. Because of the high loss tangent of the dielectric; the field is attenuated to a negligble value at the center hub 152.

Returning now to FIG. 10, if the transistors 128 of transistor packages 102 have different dc parameters, they will draw different amounts of current. Current distribution can be equalized by ballast resistors 160 incorporated in the conductor lines 150 of the RF termination and dc bias circuit. The grounded collector circuit of FIG. 10 has the advantage over a grounded base circuit, for example, in that the dc base current is low. Thus, the ballast resistors 160 can be placed in series with the microstrip distribution without decreasing the overall efficiency of the oscillator. As shown in FIG. 10, the ballast resistor is coupled in the dc bias line ahead of the junction of the bypass capacitor 158 and dc power source. The dc base bias current is obtained from a voltage divider 162 connected to the emitter dc voltage source and provides a more positive dc voltage for the dc bias circuit.

In operation of the cavity oscillator, the transistors 128 of the negative impedance packages 102 are energized to produce separate sources of microwave energy for the antennas 112. The antennas 112 radiate the microwave energy in the cavity 106 where it is combined to form a single $TM_{010}$ mode. The microwave termination circuitry 148 is used to suppress all other modes of oscillation except the said preselected $TM_{010}$ mode. The combined energy is taken from the cavity through output probe 116 and coaxial output line 118 for use in, for example, microwave ovens and radars or the like.

Many different combinations of the above elements may be made within the scope of the present invention. For example, the stripline power divider and multiple amplifiers may be used to drive a resonant cavity by means of probes on the cavity circumference. It will be apparent that other changes or modifications can be made without departing from the spirit and scope of the invention as defined by the appended claims.

What is claimed is:

1. A solid state microwave power source comprising a plurality of solid state microwave oscillators and an equal phase power combiner and impedance matching network, said oscillators coupled to input ports of said power combiner whereby the power from each oscillator is coupled to an output port in phase with all the other of said oscillators.

2. A microwave power source comprising:
  (a) a source of dc power;
  (b) a plurality of negative resistance transistor packages, each negative resistance transistor package including a transistor and a capacitor, said transistor coupled to the source of dc power and capacitor for producing a negative driving point resistance;
  (c) a plurality of microwave energy radiating elements;
  (d) a cavity, said plurality of microwave radiating elements coupled to the plurality of negative resistance transistor packages and cavity for combining the outputs of the plurality of radiating elements and exciting the cavity in a single preselected mode of oscillation;
  (e) microwave termination circuitry coupled to the said plurality of radiating elements to suppress unwanted modes of oscillation; and
  (f) an output means coupled to the cavity for conducting the combined microwave energy from the cavity to provide a high power source of microwave energy.

3. A microwave power source according to claim 2 wherein each of said plurality of negative resistance transistor packages includes a transistor having its collector attached directly to a heat sink for grounding and decreasing the thermal resistance of the device thereby increasing heat dissipation capability.

4. A microwave power source according to claim 2 wherein said capacitor is connected between the emitter and base of the transistor for decreasing the base lead inductance and making the emitter base loop resonant and the negative resistance as viewed at the collector base output substantially at maximum.

5. A microwave power source according to claim 3 wherein the plurality of microwave energy radiating elements are gapped coaxial lines connected to the transistor output of the negative resistance transistor packages with the gaps selectively positioned within the cavity for radiating the microwave energy into the cavity.

6. A microwave power source according to claim 3 wherein the cavity is a circular symmetric cavity having a preselected radius for exciting a desired mode for a preselected frequency.

7. A microwave power source according to claim 6 wherein the circular symmetric cavity receives the plurality of microwave energy radiating elements at preselected distances from the sidewall thereof and includes a centrally disposed output probe for coupling power from the cavity into a 50 ohm line.

8. A microwave power source according to claim 5 wherein the plurality of gapped coaxial lines terminate in an microwave termination and dc base bias circuit, said microwave termination and dc base circuit including a dielectric attached to the cavity, a plurality of conductors interconnecting said plurality of gapped coaxial lines to a dc source of power, the dielectric and plurality of conductors forming a microstrip circuit for microwave termination and dc biasing for the transistors of the plurality of negative resistance transistor packages.

9. A microwave power source according to claim 8 wherein a ballast resistor is connected in series with the microstrip circuit for equalizing the current distribution of the transistors of the plurality of negative resistance transistor packages.

10. A microwave power source comprising:
   (a) a source of dc power;
   (b) a plurality of microwave energy coaxial antennas;
   (c) an microwave termination and dc base biasing network said microwave termination and dc base biasing network connected to the plurality of microwave energy coaxial antennas;
   (d) a circular cavity, said cavity housing adjacent its sidewalls the plurality of microwave energy coaxial antennas and having an output probe centrally disposed therein; and
   (e) a plurality of transistor packages, each package including a transistor having a collector attached directly to a heat sink, an emitter coupled to the dc source of power, a base coupled to one of the plurality of microwave energy coaxial antennas, and dc base biasing network, and a capacitor connected between the base and emitter whereby the transistor has a negative resistance and the plurality of transistor packages and the cavity form an oscillator producing a source of microwave energy.

* * * * *